United States Patent [19]
Terasawa et al.

[11] Patent Number: 6,063,232
[45] Date of Patent: May 16, 2000

[54] METHOD AND APPARATUS FOR ETCHING AN EDGE FACE OF A WAFER

[75] Inventors: Yukihiko Terasawa, Fussa; Makoto Hamano, Okutama-machi, both of Japan

[73] Assignee: Enya Systems Limited, Japan

[21] Appl. No.: 07/978,626

[22] Filed: Nov. 19, 1992

[30] Foreign Application Priority Data

Nov. 20, 1991 [JP] Japan ..................................... 3-329765
Sep. 24, 1992 [JP] Japan ..................................... 4-279487

[51] Int. Cl.[7] .................................................. H01L 21/00
[52] U.S. Cl. .............................................................. 156/345
[58] Field of Search .................................... 156/645, 636, 156/640, 345; 134/32, 33, 149, 153, 902; 51/103 R, 283 E

[56] References Cited

U.S. PATENT DOCUMENTS

| | | | |
|---|---|---|---|
| 4,439,244 | 3/1984 | Allevato ..................................... | 134/33 |
| 4,510,176 | 4/1985 | Cuthbert et al. ........................... | 134/33 |
| 4,588,473 | 5/1986 | Hisatomi et al. .................... | 156/639 X |
| 4,718,202 | 1/1988 | Worsham ............................... | 51/283 E |
| 4,793,102 | 12/1988 | Dlouhy .................................... | 51/283 E |
| 4,838,289 | 6/1989 | Kottman et al. ......................... | 134/153 |
| 4,864,779 | 9/1989 | Ozaki .................................... | 51/283 E |
| 4,897,369 | 1/1990 | Beretta et al. ....................... | 156/636 X |
| 4,968,375 | 11/1990 | Sato et al. ............................... | 156/345 |
| 5,128,281 | 7/1992 | Dyer et al. ........................... | 156/645 X |

*Primary Examiner*—Thi Dang
*Attorney, Agent, or Firm*—Adams & Wilks

[57] ABSTRACT

A semiconductor wafer has a pair of opposed major faces separated by a peripheral edge face. The peripheral edge face of the wafer is etched by one or more etching rollers which are brought into pressure contact with the wafer edge face under suitable contact pressure. The etching rollers and the wafer are rotated while in pressure contact, and an etching liquid is supplied to the rollers and transferred to the wafer during the rotation to effect etching of the edge face of the wafer. A washing roller applies a washing liquid, such as pure water, onto the wafer edge face to wash the same. Harmful gas vapors evolved during etching are prevented from contacting the wafer surfaces by blowing a pressurized gas, such as nitrogen gas, along the wafer surfaces toward the wafer periphery.

10 Claims, 4 Drawing Sheets

METHOD AND APPARATUS FOR ETCHING AN EDGE FACE OF A WAFER

BACKGROUND OF THE INVENTION

(1) Field of the Invention

The present invention relates to a method and an apparatus for etching the edge face of a semiconductor wafer in which only the edge face of the wafer having its peripheral edge chamfered is etched.

(2) Background Information

In the production of semiconductor wafers, a chamfering process is conducted wherein the edge face of a sliced wafer is chamfered by machining. By this chamfering process, the edge face tends to have a rough surface. If the edge face of the wafer is left in this condition, smears are likely to attach thereto, dust is likely to form, and thermal strain is likely to occur.

In order to smooth the edge face of such a machine-chamfered wafer, a process is performed wherein the edge face is treated by etching. To carry out such an etching treatment, a method is known wherein a plurality of wafers are directly laminated (Japanese Unexamined Patent Publication No. 134935/1987), and another method exists wherein wafers are first laminated while interposing a special spacer between them (Japanese Examined Patent Publication No. 57612/1991), and the laminated wafers are then dipped in an etching liquid such that only the edge face of the wafers are exposed so that only the chamfered portions are etched.

Although the edge face of a sliced wafer can be etched using these methods, the process of laminating multiple wafers is troublesome and is difficult to automate. Furthermore, when implementing these methods, the surface of one wafer is brought into contact with other wafers, and the wafers are likely to be damaged when they are peeled apart one by one.

In addressing these problems, one prior art apparatus has been proposed wherein a roller having a groove portion in which the edge face of the wafer may enter without making contact with the groove is utilized. An etching liquid is retained by surface tension within the groove portion of the roller, and the edge face of the wafer is brought into contact with the etching liquid to conduct the etching treatment. An apparatus of this type is disclosed in Japanese Unexamined Patent Publication No. 316936/1989. However, in this apparatus, it is difficult to retain the required amount of etching liquid by surface tension within the groove portion of the roller.

Furthermore, in order to provide a means for positionally orienting the wafer during use thereof, the typical semiconductor wafer is provided with an "orientation flat" formed by cutting off a part of the periphery thereof in a straight line. It is very difficult to control the prior art apparatus such that the edge face of the wafer can be brought into proper contact with the etching liquid while rotating the wafer without having the orientation flat of the wafer coming out of contact with the groove portion. Furthermore, it is impossible using this apparatus to etch the edge face of the wafer into a desired shape.

SUMMARY OF THE INVENTION

Therefore, it is an object of the present invention to provide a method and apparatus for etching the edge face of a wafer which overcomes the above-mentioned problems and which enables etching of the edge face of the wafer during single wafer processing.

It is another object of the present invention to provide a method and apparatus for etching the edge face of a wafer, in which the edge face of the wafer may be etched into a desired shape.

To accomplish these and other objects, the present invention provides a method for etching an edge face of a wafer, which comprises rotating a wafer by means of a chuck, bringing the edge face of the wafer into contact with an etching roller containing an etching liquid so that the etching liquid contacts only the edge face of the wafer, and carrying out etching.

The present invention further provides a method for etching the edge face of a wafer, wherein a washing roller is brought into contact with the edge face of the wafer, thereby allowing the wafer edge face to be washed with pure water simultaneously with the etching process, thereby enabling automation of the total etching operation.

The present invention further provides an apparatus for etching the edge face of a wafer, wherein a gas stream is directed by nozzles along the surface of the wafer toward the periphery thereof to prevent gas which results from evaporation of the etching liquid from contacting the surface of the wafer.

According to one aspect of the present invention, the center portion of the back surface of the wafer is held by a chuck through suction. An etching roller is brought into contact with the edge face of the wafer, and under this arrangement the wafer and the etching roller are rotated. On the periphery of the etching roller, an etching liquid composed of an acid mixture, e.g., a mixture of hydrofluoric acid, nitric acid, acetic acid and the like, is supplied. In this manner, a small amount of etching liquid contacts the edge face of the wafer, and thus only the wafer edge face is etched.

If the direction of rotation of the wafer is periodically reversed, the edge face of the wafer can be etched in an even and highly precise condition. Furthermore, if at the same time a washing roller is brought into contact with the edge face of the wafer at a location other than that at which the etching roller contacts the wafer, and the washing roller is rotated, washing of the wafer with pure water can be conducted.

Etching liquid supplied to the etching roller evaporates during the etching process and forms harmful gas vapors. According to the present invention, a pressurized gas stream, such as of nitrogen gas, is directed along the surface of the wafer toward its periphery to prevent the gas vapors from contacting the surface of the wafer.

Furthermore, the etched shape of the edge face of the wafer depends on the shape of the portion of the wafer which contacts the etching roller, and thus a desired etched shape can be obtained by changing the shape of this contact portion.

Other objects and features of the present invention will become apparent to persons of ordinary skill in the art upon a reading of the following description of the present invention with reference to the accompanying drawings.

DETAILED DESCRIPTION OF THE PREFERRED EMBODIMENTS

Figure 1:
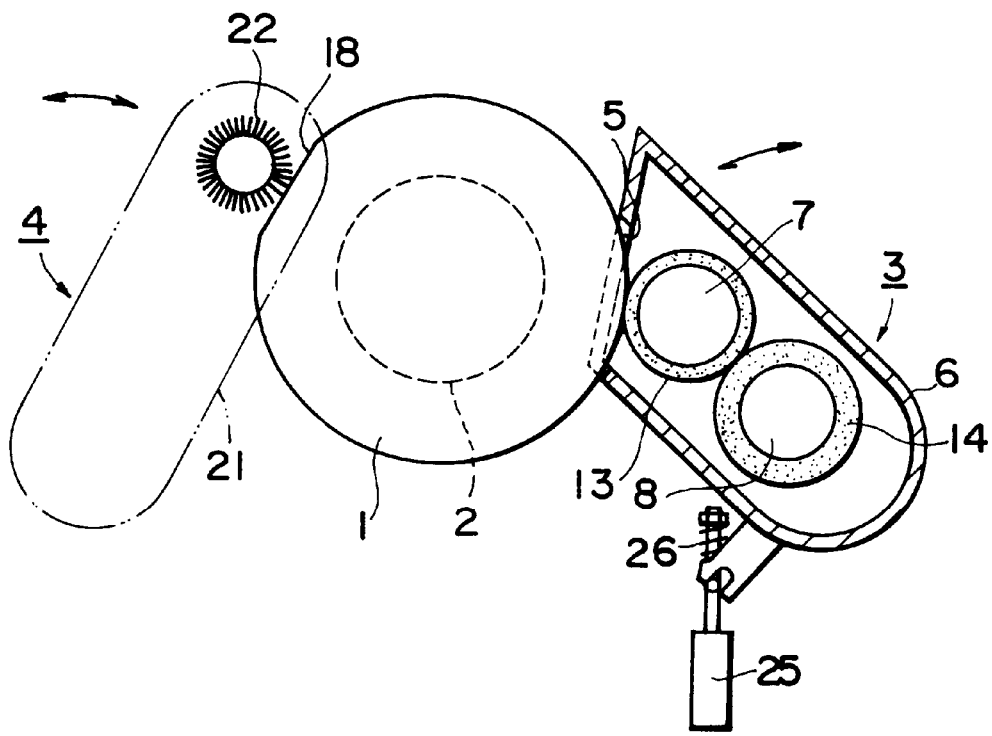
FIG. 1 is a plan view of an apparatus for etching the edge face of a wafer according to the present invention.
Figure 2:
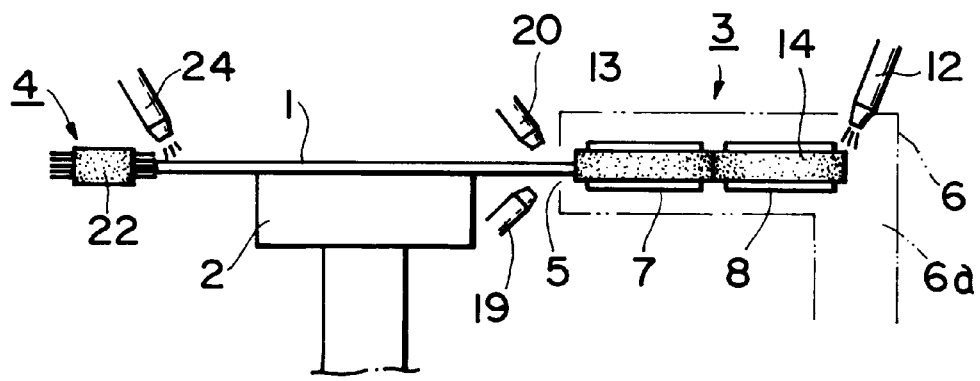
FIG. 2 is a front view showing of the apparatus for etching the edge face of a wafer according to the present invention.

FIGS. 1 and 2 are explanatory views diagrammatically showing one embodiment of an apparatus according to the present invention. A wafer 1 is releasably held via suction by a chuck means 2, such as a vacuum chuck, and rotated by the chuck means to effect etching and washing of the wafer. An etching unit 3 and a washing unit 4 are disposed on diametrically opposite sides of the wafer 1.

Figure 3:
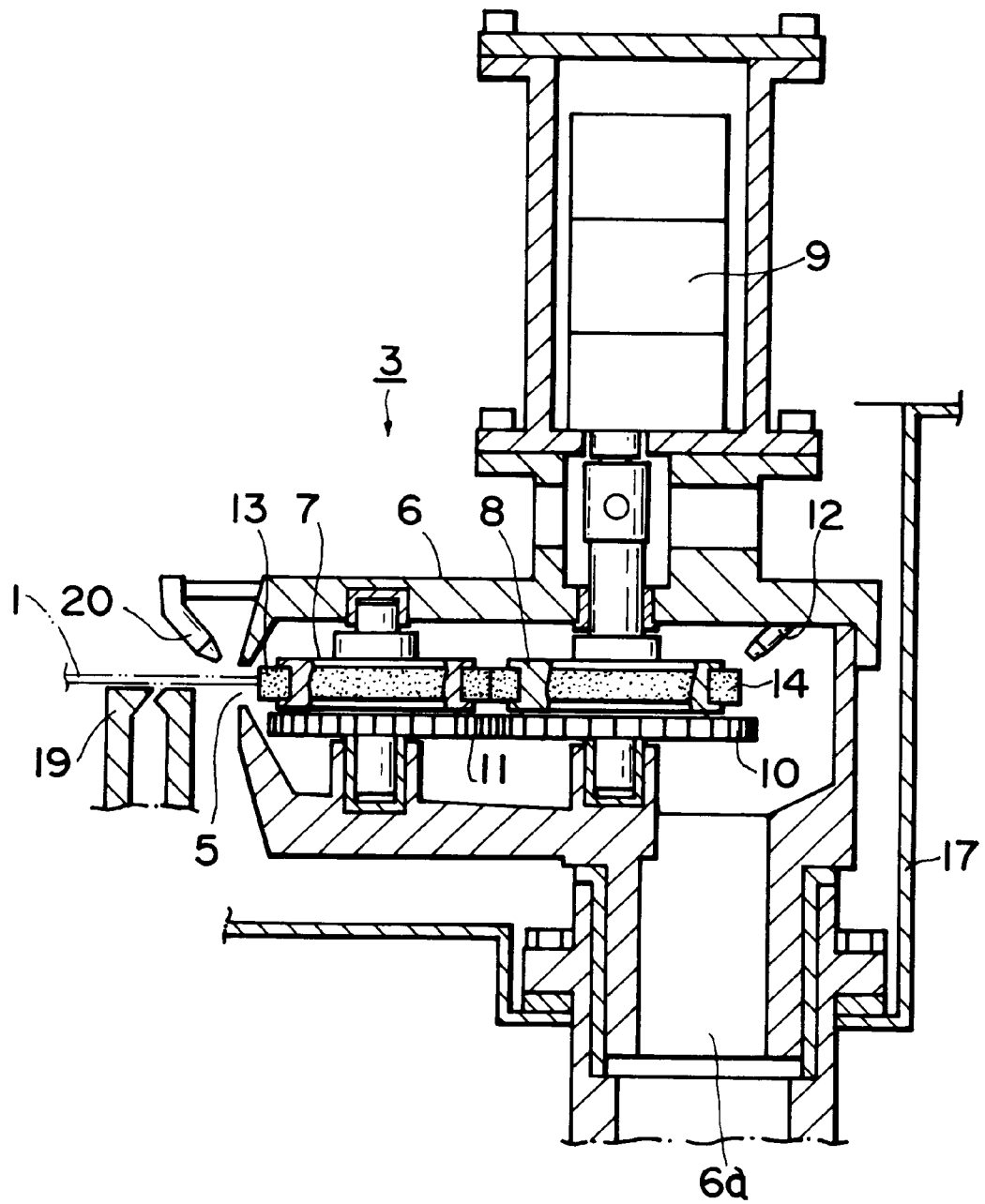
FIG. 3 is a sectional view illustrating the etching unit portion of the apparatus according to the present invention.

As shown in FIG. 3, the etching unit 3 comprises a unit body 6 which defines an enclosure having an opening 5 formed at the portion thereof located adjacent the edge face of the wafer 1. Inside the unit body 6, an etching roller 7 facing the opening 5 and a supplying roller 8 which contacts the etching roller 7 are disposed. The supplying roller 8 is rotated by a motor 9, and the etching roller 7 is rotated by the motor 9 through gears 10,11. The rotational speed of the rollers 7 and 8 may be relatively low, for example, variable within the range of from 0 to 250 rpm, and typically at a rotational speed of about 60 rpm.

On the peripheries of the supplying roller 8 and the etching roller 7, contact members 13,14 made of an appropriate material having good chemical resistance, e.g., a plastic material such as a vinyl chloride resin or a fluorine resin, are disposed to temporarily retain the etching liquid supplied from an etching liquid supplying nozzle 12. In FIGS. 1–3, the contact members 13,14 are made of a plastic foam material and possess a desired degree of elasticity. However, the contact members 13,14 need not be of foam material and may instead have a brush-like form. As shown in FIGS. 1–3, the material of the contact members 13,14 is different from that of the etching roller 7 or the supplying roller 8, but the contact members 13,14 can alternatively be formed as one piece integrally with the etching and supplying rollers, thus alleviating the necessity of providing contact members separately from the rollers.

Figure 4:
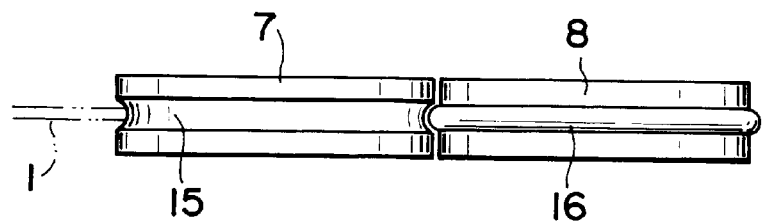
FIG. 4 is a front view showing another embodiment of an etching roller according to the present invention.

As shown in an alternative embodiment in FIG. 4, the etching roller 7 may have a groove 15 which allows the edge face of the wafer 1 to enter the etching roller 7. The supplying roller 8 may have a raised portion 16 which interfaces with the groove 15 of the etching roller 7. The shape of the groove 15 depends on the shape of the edge face of the wafer which will contact the groove, by which the edge face may be etched into the desired shape. In this embodiment, the rollers 7 and 8 do not contain the contact members 13,14.

In the embodiment shown in FIG. 3, the etching liquid is indirectly supplied from the etching liquid supplying nozzle 12 to the etching roller 7 by way of the supplying roller 8, whereby the etching liquid can be supplied evenly to the etching roller 7. Alternatively, the etching liquid may be supplied directly to the etching roller 7 by the supplying nozzle 12 or by other suitable means. The etching liquid is preferably an acid mixture, such as a mixture of hydrofluoric acid, nitric acid and acetic acid mixed in an appropriate proportion. However, an alkali etching liquid may also be used. Heat may be provided to accelerate the etching treatment. For example, the etching liquid may be heated directly or by heating the rollers, or the wafer may be heated by disposing a heater (not shown) at a location adjacent to the chuck means 2 or the wafer 1.

As mentioned above, the rollers are made of a material having good chemical resistance. However, since it is impossible to completely prevent deterioration of the rollers, it is preferred that these parts are designed so that they may be easily assembled and disassembled. For example, it is possible to combine the etching roller 7 and/or the supplying roller 8 with their respective gears so that they are easily disconnectable as a unit in the axial direction. The rollers 7,8 and their support shafts may be assembled as a self-contained unit in a separate casing which is replaceably mounted within the unit body 6 to facilitate removal and replacement of the rollers. It is also possible to provide the unit body 6 with an access door or a removable panel (not shown) to facilitate the replacement operation.

The inside of the unit body 6 is constructed so that gas evaporating from the etching liquid does not flow out of the opening 5. In FIG. 3, an exhaust device (not shown) is disposed within the discharging path 6a disposed under the unit body 6 to exhaust the air within the unit body 6 downwardly.

The etching unit 3 is turnably disposed on an apparatus body 17 (FIG. 3) and is operated by an appropriate driving means, such as an air cylinder 25 (FIG. 1), so that the etching unit 3 may be turnably displaced between an operating position where the etching roller 7 abuts the edge face of the wafer 1 and a non-operating position where the etching roller 7 is spaced apart from the wafer 1. The abutting pressure of the etching roller 7 against the wafer 1 may be adjustably set to an appropriate pressure. For example, the abutting pressure may be varied within the range of from approximately 0.3 kg/cm$^2$ to 3 kg/cm$^2$, and typically at a pressure of about 1 kg/cm$^2$. Such a pressure may be controlled by the above-described driving means.

In order to control the contact pressure at which the etching roller 7 abuts the peripheral edge face of the wafer 1, the unit body 6 is pivotally urged toward the wafer by a biasing spring 26 which pivotally urges the unit body 6 in the counterclockwise direction in FIG. 1. The abutting pressure is adjusted by regulating the compressive force of the spring 26 so that the etching roller 7 abuts an orientation flat edge 18 of the wafer 1 at a suitable contact pressure during rotation of the wafer 1, thereby ensuring proper contact pressure between the etching roller and the remaining peripheral edge portion of the wafer. Other means, such as the weight of the etching unit 3, may be used to bias the unit body 6 and thus the etching roller 7 into pressure contact with the wafer 1.

As mentioned above, the acid mixture used as the etching liquid supplied to the etching roller 7 tends to form harmful gas vapors during the etching process. Since partial exhaustion of the gas vapors may sometimes be unsatisfactory, the present invention provides means for preventing the outflow of gas from the opening 5 of the etching unit 3. In this manner, the harmful gas vapors evolved during etching are confined within the etching unit 3 and are not permitted to escape to the ambient atmosphere.

In the embodiment shown in FIGS. 1–3, the means for preventing the outflow of gas comprises a set of nozzles 19,20 disposed around the opening 5 for directing a flow of pressurized gas toward the opening 5 to effectively prevent the escape of harmful gas vapors from the etching unit 3. As illustrated in FIG. 2, the nozzles 19,20 are disposed in a ring around the periphery of the opening 5 with the nozzle tips facing toward the opening 5. The blow-off nozzles 19,20 are arranged to direct the pressurized gas, such as nitrogen gas, in the form of a ring that encircles the wafer 1 in the region where it projects through the opening 5 into the unit body 6 and in a direction toward the opening 5. The pressurized gas flow from the blow-off nozzles effectively blocks the outflow of gas vapors through the opening 5. In the event the upper surface of the wafer 1 is to be polished in a subsequent step, the upper nozzles 20 need not be used as any damage that may be done to the wafer surfaces by the etching liquid vapors can be satisfactorily repaired during the subsequent polishing.

In order to further avoid the outflow of gas evaporating from the etching liquid, a vacuum suction device (not shown) may be disposed inside of the unit body 6 in the neighborhood of the opening 5, wherein the vacuum action causes the pressure inside of the unit body 6 to be significantly less than the pressure outside the unit body 6, thereby forcing the etching liquid gas to be exhausted downwardly within the unit body 6. Alternatively, an air curtain may be formed adjacent the opening portion 5 to prevent the outflow of the etching liquid gas.

Figure 5:
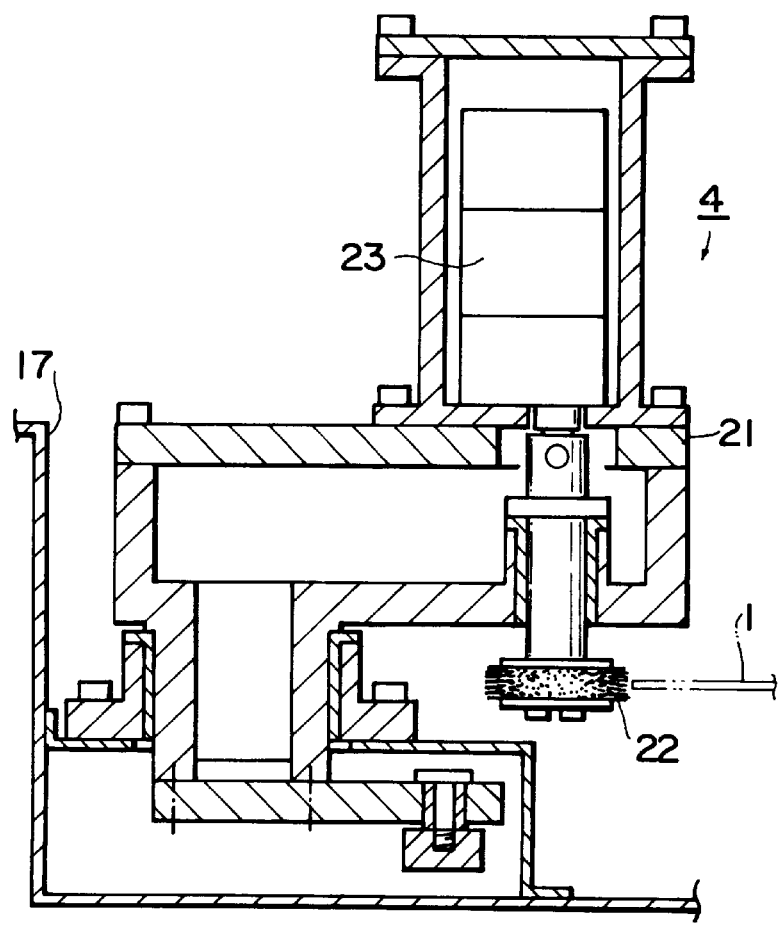
FIG. 5 is a sectional view illustrating the washing unit portion according to the present invention.

As illustrated in FIG. 5, the washing unit 4 comprises a washing unit body 21 turnably disposed on the apparatus body 17. A washing roller 22 and a motor 23 which rotates the roller 22 are disposed on the washing unit body 21. As shown in FIGS. 1–2, the roller 22 makes pressure contact with the peripheral edge face of the wafer 1 while a washing liquid such as pure water is supplied onto the wafer surface by a nozzle 24, whereby the edge face is washed. In FIGS. 1, 2 and 5, the washing roller 22 is shown as a brush. However, an elastic roller having an elastic material, such as a foam material disposed around the roller, may also be employed.

The contact pressure of the washing unit 4 against the peripheral edge face of the wafer 1 is preferably controlled to result in substantially the same pressure as the contact pressure of the etching unit 3 against the wafer 1. The driving means for turnably displacing the washing unit 4 and the urging means for urging the washing unit toward the wafer 1 may have substantially the same structure as described above for the etching unit 3. Although during operation the washing unit 4 and the etching unit 3 are in contact with the edge face of the wafer 1 at the same time, the washing unit 4 may be brought into contact with the edge face of the wafer 1 after the etching unit 3 is brought into abutment with the wafer.

In operation of the apparatus, the wafer 1 is transported to and placed above the chuck means 2 using an appropriate conveying means, and the chuck means 2 is actuated to releasably hold thereon the wafer. The chuck means 2 is then rotated at a moderate rotational speed, for example, within the range of from approximately 0 to 200 rpm, and preferably at about 30 rpm, to rotate the wafer 1. Then the etching unit 3 is turnably displaced to bring the etching roller 7 into contact with the peripheral edge face of the wafer 1, and at the same time, the washing unit 4 is turnably displaced to bring the washing roller 22 into contact with the peripheral edge face of the wafer 1. The contact pressures of the etching roller 7 and the washing roller 22 with the wafer 1 are controlled and maintained at a constant level while the rollers are rotating. The wafer 1 is preferably rotated in the reverse direction to the rotation of the etching roller 7 and the washing roller 22. However, the wafer 1 and the rollers 7,8 may all be rotated in the same direction, if desired.

Under such conditions, the etching liquid is transferred to the peripheral edge face of the wafer 1 by means of the etching roller 7, and after the wafer is rotated in one direction approximately 5 revolutions, the wafer is rotated in the reverse direction substantially the same number of revolutions, thereby etching the edge face of the wafer. Then the etching unit 3 is turnably displaced in the opposite direction and disengaged from the wafer 1, and the opposed surfaces of the wafer are rinsed with pure water and spin-dried. The wafer 1 is removed from the chuck means 2 using an appropriate conveying means, and the next wafer is transported to and positioned above the chuck means in the same manner as done in the case of the removed wafer.

In the above-described embodiment, one etching roller is used. Alternatively, a plurality of etching rollers may be used. For example, a plurality of etching units 3 of the type shown in FIG. 1 may be disposed circumferentially about the peripheral edge face of the wafer.

Figure 6:
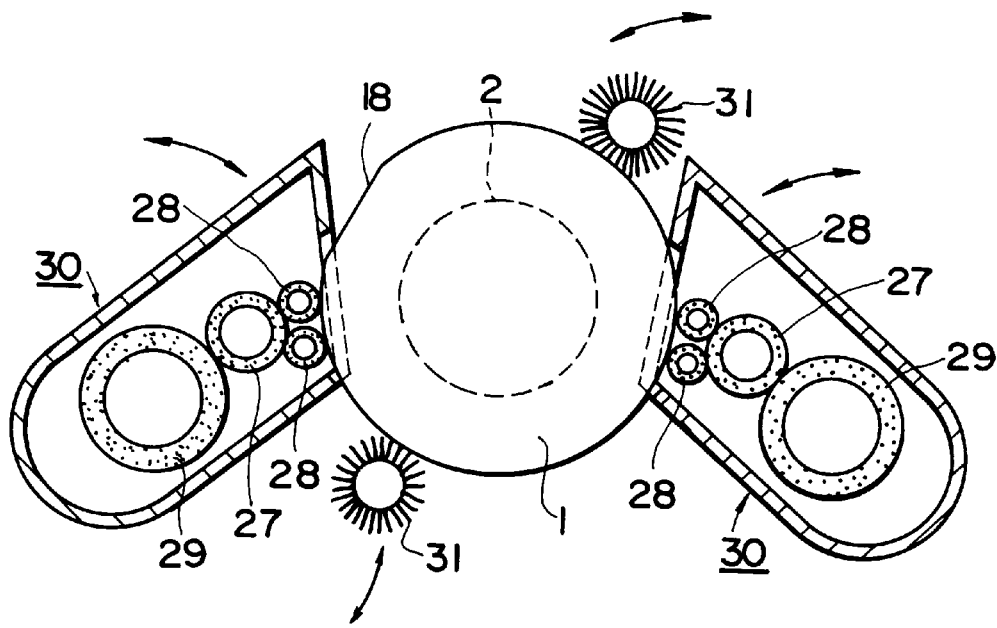
FIG. 6 is a plan view of another embodiment of an apparatus for etching the edge face of a wafer according to the present invention.

FIG. 6 shows an embodiment comprising a plurality of etching units 30 each having a pair of etching rollers 28 which rotate such that the rollers are in contact with a common supplying roller 27. The etching rollers 28 preferably have a small diameter as compared with that of the supplying roller 27. By such a construction, fresh etching liquid is supplied continuously from a first supplying roller 29 to the small etching rollers 28 by way of the supplying roller 27, whereby the etching treatment can be carried out efficiently. Alternatively, the first supplying roller 29 can be omitted, in which case the etching liquid is supplied directly to the supplying roller 27.

As shown in FIG. 6, the etching units 30 are disposed at circumferentially spaced locations around the wafer 1, and washing units (not shown) each having a washing roller 31 are disposed at circumferentially spaced locations around the wafer adjacent the etching units. If desired, one etching unit 30 and one washing unit may be used instead of a plurality of such units. The driving means for the etching units 30 and the washing units is substantially the same as in the previous embodiment, and thus is not shown in the drawing. In addition, the structure of the nozzles for blowing the pressurized gas, such as nitrogen gas, onto the opposed surfaces of the wafer 1 to prevent outflow of the etching liquid gas is substantially the same as in the previous embodiment.

Figure 7:
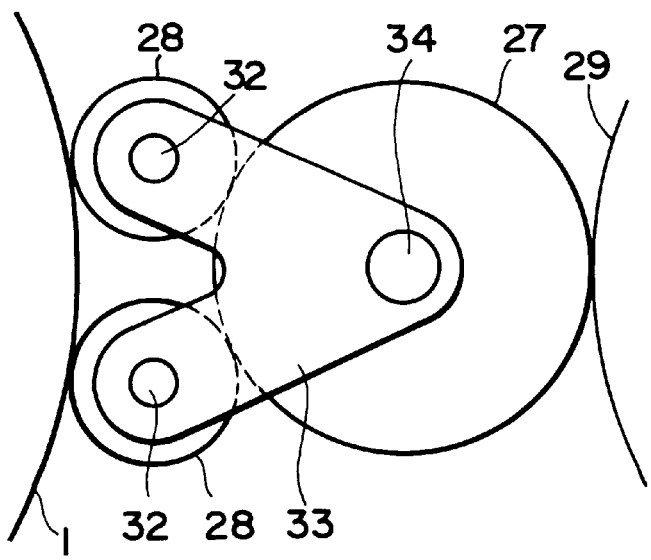
FIG. 7 is an enlarged plan view of the etching roller portion of the apparatus for etching the edge face of the wafer as shown in FIG. 6.

A modification of the etching units 30 shown in FIG. 6 is illustrated in FIG. 7. In this embodiment, a frame 33 having shafts 32 for the pair of etching rollers 28 is swingably pivoted to a shaft 34 of the common supplying roller 27. By such a structure, when the pair of etching rollers 28 is brought into contact with the orientation flat 18 of the wafer 1, the rollers will pivotably move along the orientation flat 18, thereby securing pressure contact with the orientation flat 18 in the etching process.

The etching treatment of the wafer edge face according to the present invention may be conducted at any time after the chamfering process and before the surface polishing process. Furthermore, the etching treatment can be conducted at any time during semiconductor production, as desired.

According to the present invention, the etching treatment of the peripheral edge face of a wafer can be conducted during the processing of single wafers. Furthermore, the wafer is not damaged. The treatment can be conducted by full automation. Finally, high surface precision can be attained using the present invention as compared with conventional lamination etching methods.

We claim:

1. An apparatus for etching a peripheral edge face of a wafer, comprising: rotatable chuck means for releasably holding a wafer having a pair of opposed major faces separated by a peripheral edge face; a rotatable etching roller having a peripheral face; means mounting the etching roller for displacement into and out of an operating position wherein the etching roller face contacts the wafer edge face; means for supplying etching liquid onto the etching roller face for transfer to the wafer edge face; an enclosure containing therein the etching roller and the means for supplying etching liquid onto the etching roller face, the enclosure having an opening throuah which a peripheral edge portion of the wafer extends into the enclosure for contact with the etching roller face; and means for rotating the wafer and etching roller while in contact with one another to effect transfer of the etching liquid, within the enclosure, from the etching roller face to the wafer edge face accompanied by etching of the wafer edge face.

2. An apparatus according to claim 1; including means for urging the etching roller face into pressure contact with the wafer edge face when the etching roller is in the operating position.

3. An apparatus according to claim 2; including means for adjustably setting the contact pressure between the etching roller face and the wafer edge face.

4. An apparatus according to claim 1; including means for preventing gas vapors evolved from the etching liquid from flowing onto at least one of the opposed major surfaces of the wafer.

5. An apparatus according to claim 4; wherein the means for preventing comprises means for directing a pressurized gas stream along the at least one major surface of the wafer toward the peripheral edge face thereof.

6. An apparatus according to claim 4; wherein the means for preventing comprises means for preventing outflow of gas vapors from the enclosure through the enclosure opening.

7. An apparatus according to claim 6; wherein the means for preventing outflow of gas vapors comprises a plurality of nozzles disposed around the enclosure opening for directing pressurized gas toward the opening to effectively prevent gas vapors from flowing out of the opening.

8. An apparatus according to claim 1; including washing means for washing the wafer edge face with a washing liquid.

9. An apparatus according to claim 8; wherein the washing means comprises a rotatable washing roller displaceable into contact with the wafer edge face.

10. An apparatus according to claim 2; including a plurality of rotatable etching rollers each having a peripheral face and being disposed in circumferentially spaced-apart relation about the wafer edge face to make contact therewith, and means for supplying etching liquid onto each of the etching roller faces.

* * * * *